(12) United States Patent
Larsson

(10) Patent No.: US 6,310,498 B1
(45) Date of Patent: Oct. 30, 2001

(54) DIGITAL PHASE SELECTION CIRCUITRY AND METHOD FOR REDUCING JITTER

(75) Inventor: Patrik Larsson, Matawan, NJ (US)

(73) Assignee: Agere Systems Guardian Corp., Orlando, FL (US)

(*) Notice: Subject to any disclaimer, the term of this patent is extended or adjusted under 35 U.S.C. 154(b) by 0 days.

(21) Appl. No.: 09/208,523

(22) Filed: Dec. 9, 1998

(51) Int. Cl.[7] ................. H03L 7/00; H03K 5/00
(52) U.S. Cl. ............. 327/158; 327/149; 327/141
(58) Field of Search .................. 327/147, 149, 327/156, 158, 141, 99, 153, 161, 277, 284, 269; 331/2, 14

(56) References Cited

U.S. PATENT DOCUMENTS 5,389,898 * 2/1995 Etoshi et al. .................. 331/2
5,889,436 * 3/1999 Yeung et al. .................. 331/2

* cited by examiner

Primary Examiner—Dinh T. Le
(74) Attorney, Agent, or Firm—Henry I. Schanzer

(57) ABSTRACT

In systems embodying the invention a voltage responsive circuit is used to generate a number of different clock signals having the same frequency, with each clock signal being delayed relative to any other clock signal by a certain delay which is a function of the amplitude of a control voltage applied to the voltage responsive circuit. The clock signals are multiplexed to enable any one of the different clock signals to be selected and to then be compared with a reference frequency signal for producing a gradually varying control voltage which is applied to the voltage responsive circuit. The different clock signals are suited for use in applications such as clock recovery and frequency synthesizer systems, where very little jitter is desired.

36 Claims, 6 Drawing Sheets

DIGITAL PHASE SELECTION CIRCUITRY AND METHOD FOR REDUCING JITTER

BACKGROUND OF THE INVENTION

This invention relates to phase selection of a clock signal and, in particular, to apparatus and methods for producing different phases of a clock signal and for selecting certain of these clock signals for operating a system with reduced jitter.

In many systems, such as in digital clock recovery systems and frequency synthesis systems, clocking (or "timing") signals are generated for "retiming" incoming data and/or performing needed timing/clocking operations. By way of example, in a digital clock recovery system, a basic clock signal of given frequency is generated together with a number of different clock signals of like frequency but with different phases, e.g., the different clock signals may be generated by applying the basic clock signal to analog and/or digital delay networks. Then, in the course of operating the system different ones of the clock signals are compared to the phase and frequency of an incoming data stream and certain ones of the clock signals are selectively switched into use by the system for performing data recovery. However, when a clock signal of one phase is switched into the system to replace a clock signal of a different phase there is a fixed, discrete, jump in the phase (timing) of the clock signal being used, even though the frequency is the same. The "jumping" back and forth in the phase of the clocking signal is problematic in that it introduces a certain discrete amount of jitter in the clocking/timing signals generated by the system and used therein.

The nature of the problem present in prior art systems may be better explained with reference to the prior art clock recovery circuit shown in of FIG. 1 which includes a clock generation system for producing a clock signal with a predetermined number of phases. The clock generation circuit includes a reference clock signal (fref) applied to the input of a voltage controlled delay line (VCDL) 12 which is shown to include 4 inverters (I1,I2, I3,I4) connected in cascade between an input terminal 11 to which is applied fref and an output terminal 13. The signal fref and the output of VCDL 12 are applied to a phase detector 14 which produces an output which controls a charge pump circuit 16 whose output is supplied to a filter 18 whose output voltage controls the delay in (and of) the stages of VCDL 12. Consequently each one of the inverters in VCDL 12 produces a differently phased clock (i.e., φ1, φ2, φ3, φ4) but with all the clock signals having the same frequency.

The four output clocks (φ1, φ2, φ3, φ4) of VCDL 12 are supplied to a multiplexer 20, which in response to a control signal (CTLS) selects one of the four VCDL generated clocks and couples it to the multiplexer output line 23. In a clock recovery system an incoming data signal stream (DATA) applied to the system is compared to the phase of the clock signal on line 23 to ascertain that the data being received by the system has a particular frequency and phase. The clock signal on line 23 is applied to one input of a phase detector 22 having another input 24 to which is applied the incoming data signal stream (DATA) whose frequency and phase is to be ascertained. If there is a difference in phase between the incoming DATA on line 24 and the clock signal on line 23 an error signal is generated which is applied to a control circuit 25 which then produces an output signal (CTLS) on line 21 to cause multiplexer 20 to switch and select a different phase (i.e., a different one of the four clock signals being outputted by VCDL 12) until there is a match between the frequency and phase of the clock signal and the frequency and phase of the incoming DATA. Note that the clock signal on line 23 and the incoming data signals are also applied to a data sampling flip-flop 26 at whose output is produced a "retimed" data signal which is then fed to an electronic system for processing. The clock signal on line 23 thus functions as a sampling clock which may also be termed the data "recovery" clock. Theoretically, to best sample the true value of incoming data bits, the sampling clock should sample the incoming data bits midway between the rising and falling edges of a data bit. When the sampling clock is subject to jitter the sampling clock may occur at or near the (rising or falling) edges of the incoming data bits resulting in a high number of erroneous sampling of the incoming data.

Thus, a problem with the circuit of FIG. 1 is that when the control signal CTLS activates the multiplexer to select a different clock signal, the clock "recovery" signal at the output of the multiplexer, which is applied to line 23, switches from one phase of the clocking signal to another phase of the clocking signal. This causes a discrete jump and resulting jitter, having a fixed minimum value, in the clocking and sampling signals supplied to the system and in the data to be processed by the system.

SUMMARY OF THE INVENTION

In systems embodying the invention a voltage responsive circuit, e.g., a voltage controlled oscillator (VCO) or a voltage controlled delay line (VCDL), is used to generate X different clock signals having the same frequency but different phases, where X is any integer greater than one. The different clock signals are multiplexed and the multiplexed output is compared to a reference frequency for producing a control voltage (VCTL) applied to the voltage responsive circuit.

In a particular embodiment of the invention the multiplexing of the different clock signals includes the application of the X different clock signals to the input port of a selection circuit which is responsive to a control signal for selecting a different one of the X clock signals and for supplying the selected clock signal at an output of the selection circuit. The selected clock signal is then compared to a reference frequency signal to produce the control voltage applied to the voltage responsive circuit.

In a particular embodiment of the invention, a designated one of the different clock signals generated by the voltage responsive circuit is compared with an incoming data signal stream for producing the control signal which is indicative of their phasal and frequency relationship. This control signal controls the selection of the different clock signals to be compared with the reference signal. Also, the designated one of the different clock signals, or any other ones of the X clock signals, may be used as a clock ("data") recovery signal to sample the incoming data signal stream for producing "retimed" data signals ready for further data processing.

In accordance with the invention, the control voltage applied to the voltage responsive circuit (VCO or VCDL) is a gradually varying voltage although it is produced by selectively switching from a first clock signal having one phase to a second clock signal having another phase and by comparing the new switched-in clock signal with the reference signal. The gradually varying control voltage causes the phase and/or frequency of the X clock signals produced by the voltage responsive circuit to vary gradually. The use of any of these gradually varying X clock signals as a clock recovery signal reduces the jitter in the data signals transmitted for processing.

Thus, in circuits embodying the invention, the clock recovery signal is a designated one of the X clock signals which varies gradually from one value towards a second value. This is in contrast to the prior art scheme, discussed above, where the clock recovery signal is obtained by switching between different phases of the clock signals. This switching causes the clock recovery signal to switch quickly from one value to another value and results in jitter in the data signals transmitted for processing.

BRIEF DESCRIPTION OF THE DRAWING

In the accompanying drawing like reference characters denote like components.

FIG. 6 is a block diagram of a clock recovery system embodying the invention using a divide-by-N network; and FIG. 7 is a block diagram of a frequency synthesizer embodying the invention.

DETAILED DESCRIPTION OF THE INVENTION

Figure 2:
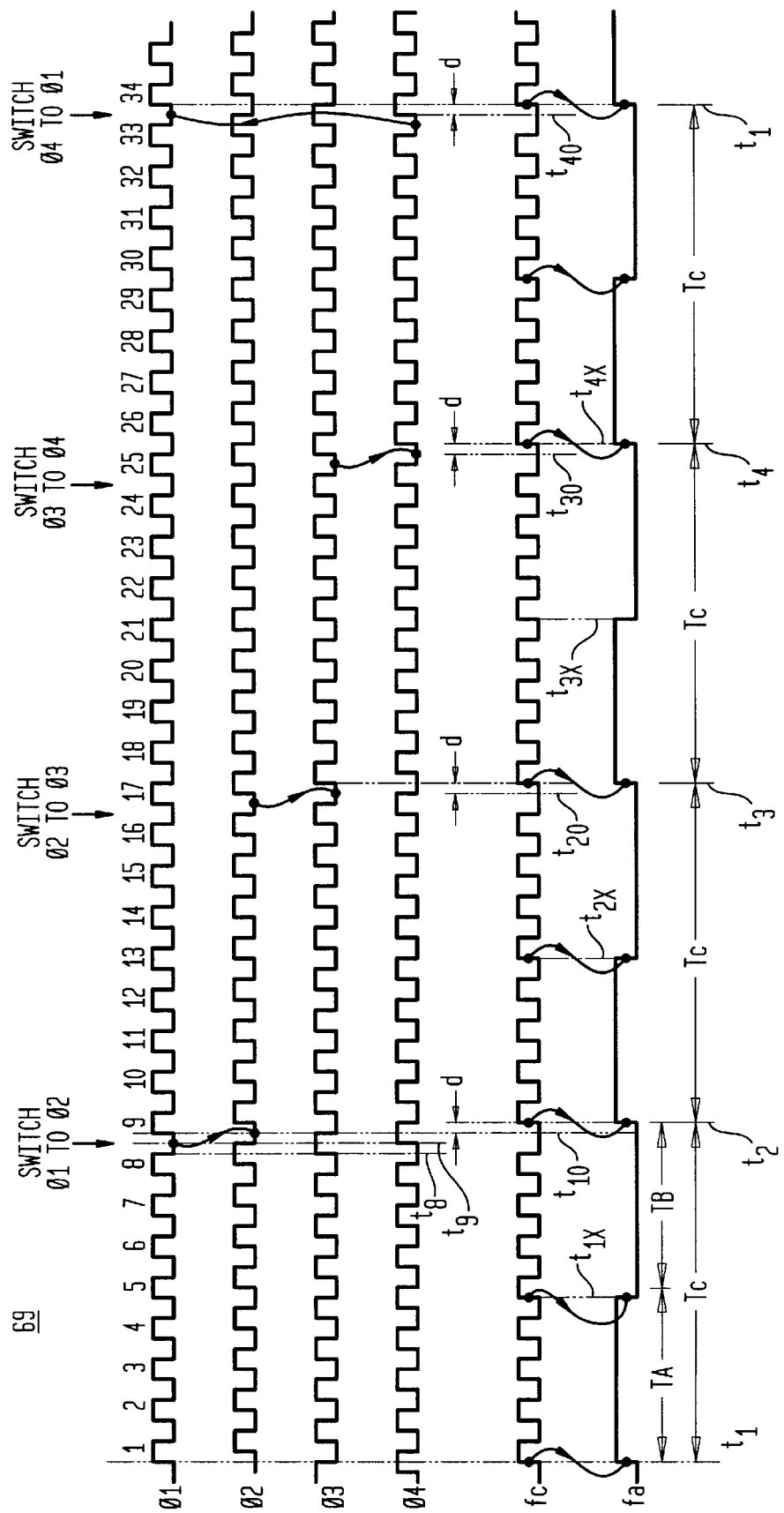
FIG. 2 is a block diagram of a clock recovery system embodying the invention.

Referring to FIG. 2 there is shown a clock recovery circuit embodying the invention. The circuit of FIG. 2 includes a phase locked loop (PLL) comprised of a phase detector 14, a charge pump 16, a filter 18, a voltage controlled oscillator (VCO) 42 and a multiplexer 20. In the discussion of the invention to follow, it should be appreciated that the phase detector 14, the charge pump 16, the filter 18 and the voltage controlled oscillator 42 may be of the type shown in my co-pending application titled Phase Locked Loop (PLL) Circuit filed Dec. 9, 1998 and bearing Ser. No. 09/208,524 and also assigned to the assignee of this application whose teachings are incorporated herein by reference. In addition, it should be noted that any suitable phase detector, charge pump, filter and VCO may be used to practice the invention.

Figure 1:
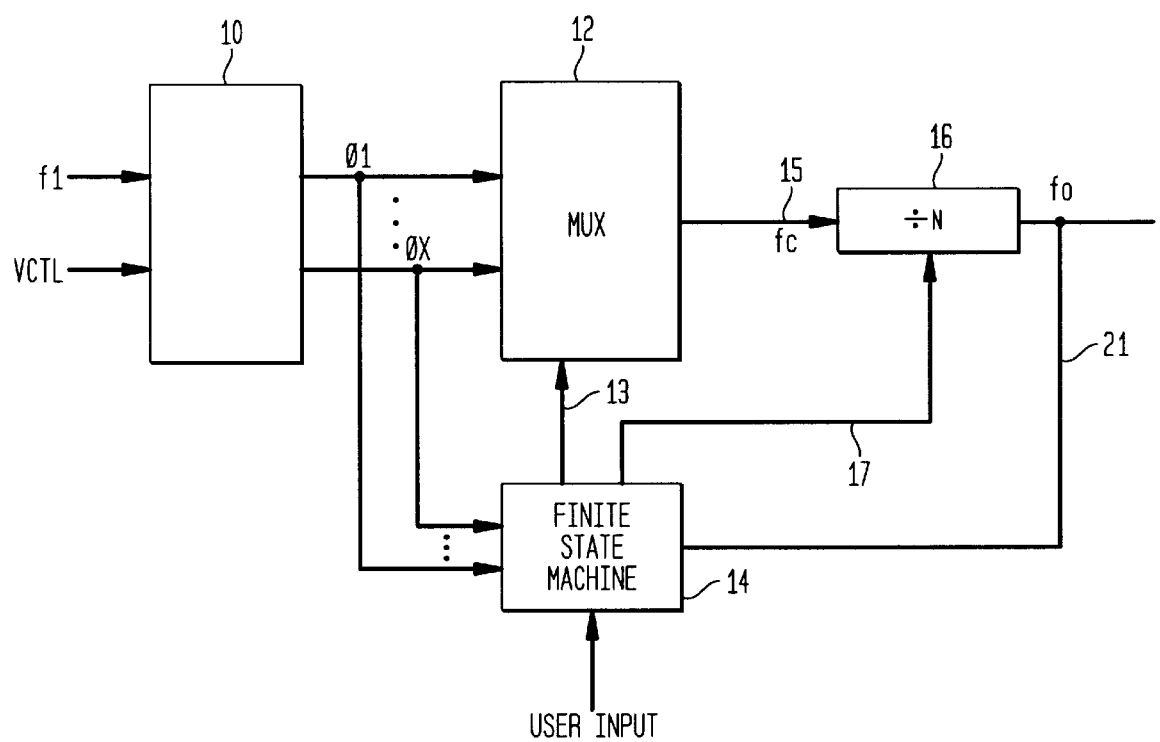
FIG. 1 is a block diagram of a prior art clock recovery system.
Figure 1A:
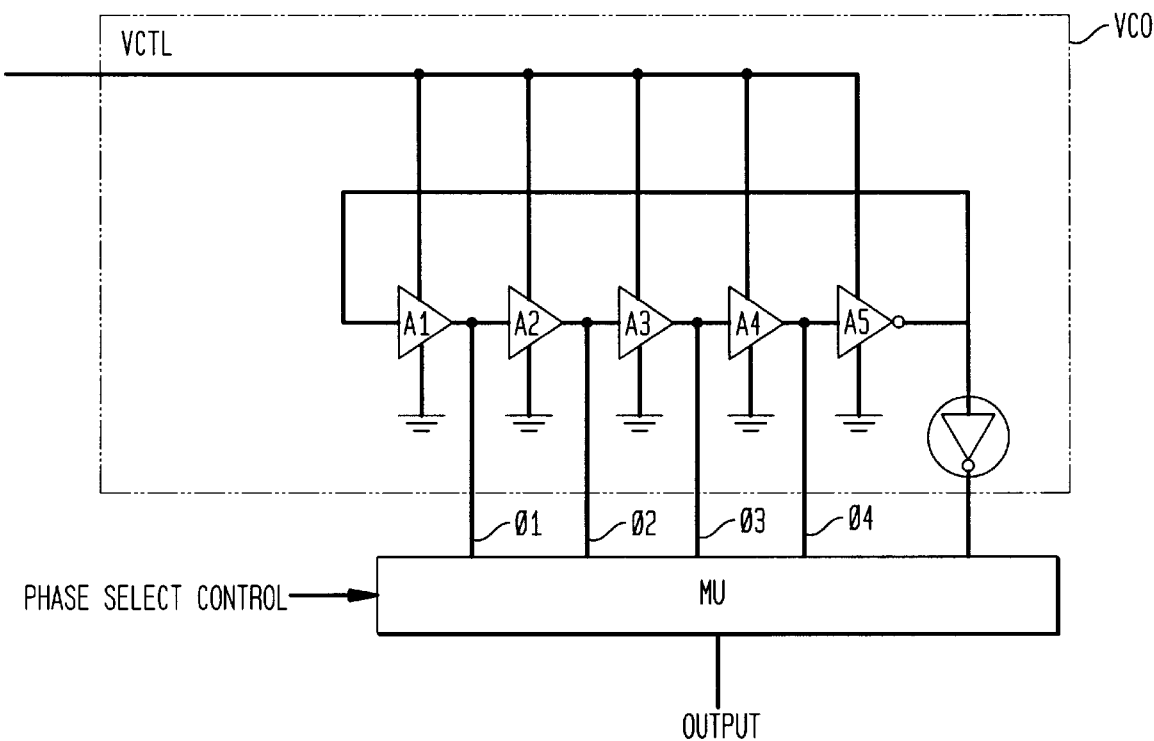
Figure 1B:
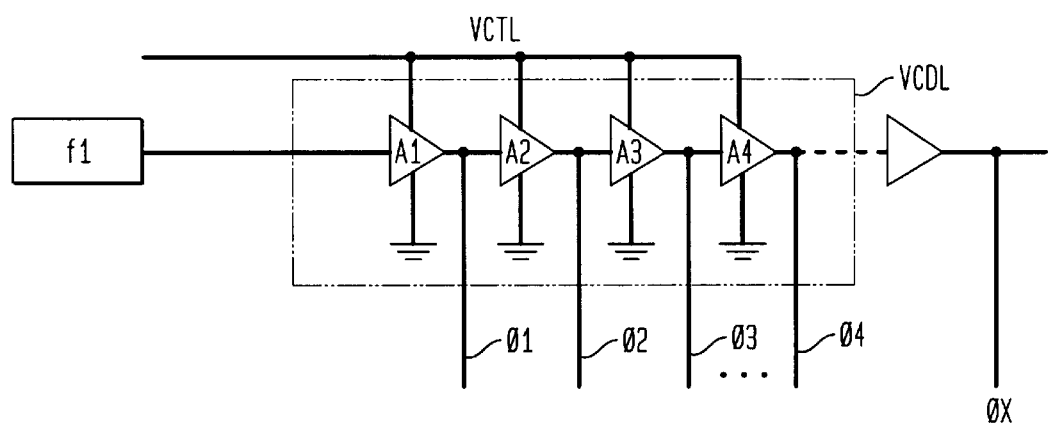

In sharp contrast to the prior art circuit of FIG. 1, in FIG. 2, the clock recovery signal (crs) used to sample the incoming data (DATA) and to generate the retimed data is a fixed, preselected, clock signal which is obtained from an output of the VCO (or the output of a VCDL), rather than from the output of the multiplexer. It is important to recognize that the preselected clock recovery signal output from the VCO, selected for sampling and clocking, varies slowly and continuously because its response is controlled by the output voltage of a low pass (integrating) filter circuit 18. By way of example, the filter 18 is shown to include an RC network. The output of the filter circuit varies in an analog and in a continuous manner from one voltage level to another voltage level, rather than varying in discrete (quantum) steps between two different and distinct voltages, frequencies or phase values.

In the circuit of FIG. 2, the VCO 42 is shown, by way of example, to have 5 different and distinct outputs ($\phi1$, $\phi2$, $\phi3$, $\phi4$ and crs) which are applied to a multiplexer 20 whose output 230 is fed back via an output line 231 to an input 141 of a phase detector 14. The multiplexer 20 is controlled by a control signal CTLS, similar to the prior art block diagram of FIG. 1. The control signal CTLS determines which one of the clock signals produced at the output of VCO 42 and inputted to multiplexer 20 gets coupled to the multiplexer output line 231 and via line 231 to input 141 of phase detector 14. When the multiplexer 20 is caused to switch, a different one of the clock signals inputted to multiplexer 20 is selected and coupled to its output. The clock signal at the output of the multiplexer will then jump between (or from) one clock signal having a given phase to another clock having the same frequency but another, different, phase. Thus, the clock signals switched onto the multiplexer output line 231 will vary in discrete or quantum steps. However, note that each one of the clock signals varies gradually from one value to another value, as is described below.

In the circuit of FIG. 2, the phase detector 14 has a first input 140 to which is applied a reference clock signal (fref) and a second input 141 which is connected via line 231 to the output 230 of multiplexer 20. The phase detector 14 produces an error signal at its output 15 whenever the multiplexer output and fref are not in phase. The error signal at the output of phase detector 14 then controls the current output of a charge pump circuit 16 which is supplied to the filter circuit 18 which is an integrating network. The integrating network 18 may be an RC network or any other suitable integrator or low pass filter network. The charge pump circuit supplies either a charging (sourcing) current or a discharging (sinking) current to the filter circuit 18. Due to the integrating nature of filter network 18, the voltage produced at the output of filter 18 will gradually increase or decrease as a function of time. The slowly varying output of filter network 18 defines the amplitude of the control voltage (VCTL) which is applied to the VCO 42. The VCTL applied to VCO 42 causes its frequency (and phase) to change until its frequency (and phase) are in synchronism with fref.

Figure 3:
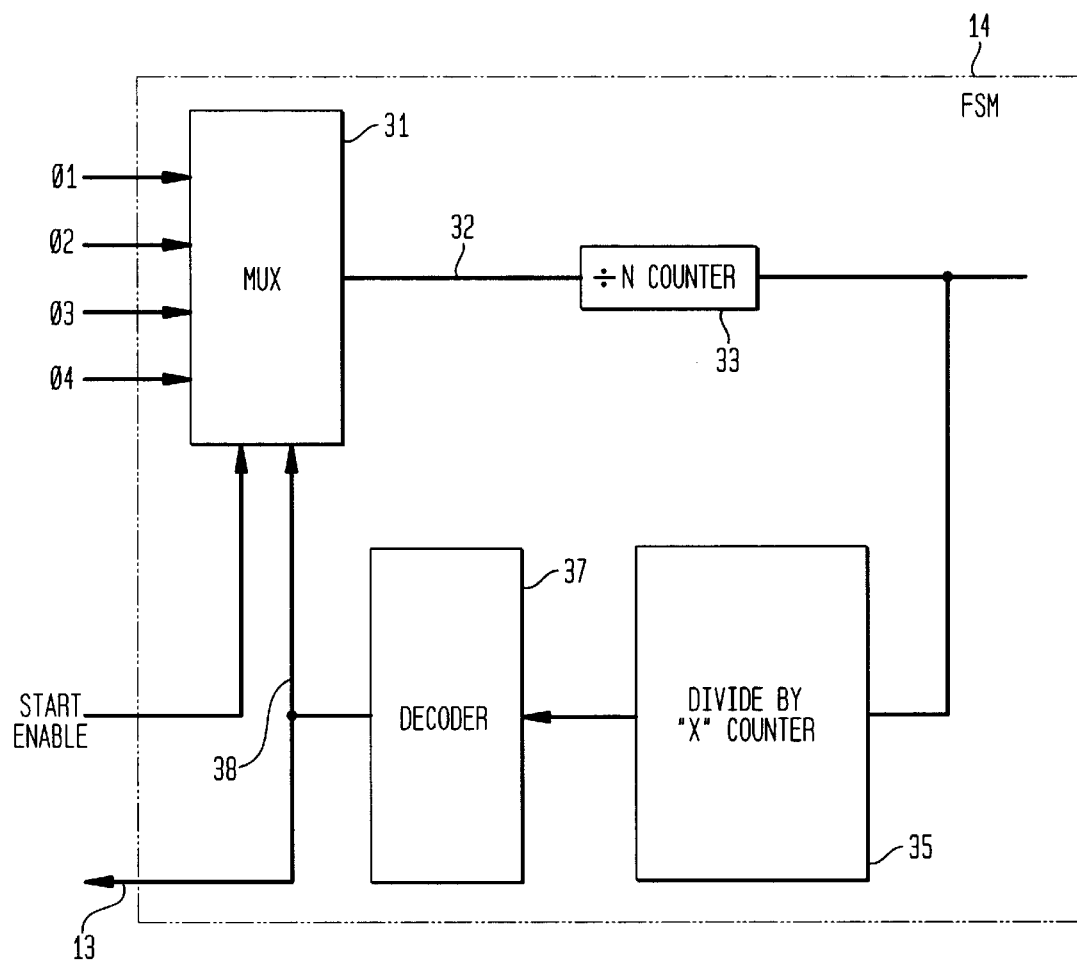
FIG. 3 is a block diagram of a voltage controlled oscillator (VCO) and a multiplexer arrangement suitable for use in systems embodying the invention.
Figure 4:
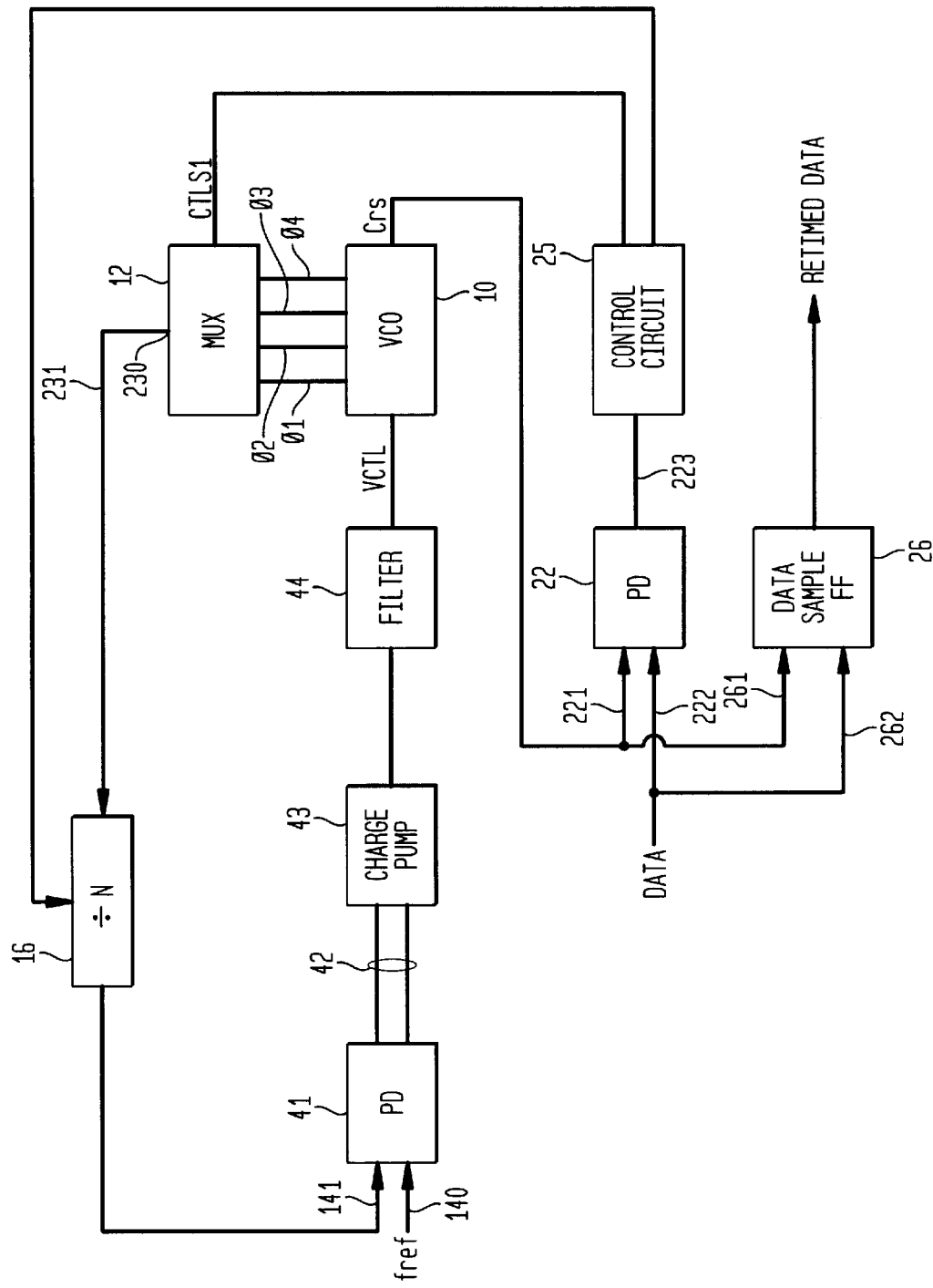
FIG. 4 is a waveform diagram illustrating various phases of clock signals produced by a VCO.

In the circuit of FIG. 2, VCO 42 is shown, by way of example, to have 5 different and distinct outputs (($\phi1$, $\phi2$, $\phi3$, $\phi4$ and crs) which are applied to multiplexer 20 whose output 230 is fed back to input 141 of phase detector 14. VCO 42 may be any suitable voltage controlled oscillator and/or any suitable voltage responsive circuit (e.g., a VCDL) capable of producing a multiplicity of different clock signals having the same frequency with each clock signal having a different phase. The VCO (or VCDL) used to practice the invention may have many different forms. An example of a VCO suitable for use in systems embodying the invention is shown in FIG. 3. The VCO 42 in FIG. 3 includes five (5) inverters ($I_1$, $I_2$, $I_3$, $I_4$, $I_5$) connected in cascade with the output (crs) of inverter Is being fed back to the input of inverter $I_1$. Each one of these five inverters may be a simple complementary metal oxide semiconductor (CMOS) structure or a more complex structure, as is known in the art. In order to form an oscillating loop, the VCO will normally include an odd number of inverting functions (i.e., at least one inverter). In FIG. 3, the output signal of each one of the five inverters in the loop is inverted and delayed relative to the signal applied at its input. The delay of each one of the five inverters is a function of its output impedance and the capacitance present at its output node, as well as the operating voltage placed across the inverter. For ease of explanation, it is assumed that the five inverters (i.e., $I_1$, $I_2$, $I_3$, $I_4$, $I_5$) forming the VCO loop (and each stage in the VCO loop, whether or not it is an inverting stage) have similar characteristics and have the same delay and hence, the phase spacing and timing between the different clock signals will be the similar, as shown in FIG. 4. In the circuit of FIG. 3 and as shown in FIG. 4, each one of the five inverter output signals has the same frequency, as any other inverter output signal, with each inverter output signal being delayed by the same amount of space relative to the adjacent output signals (i.e., each clock having a different, but generally equal, phase relative to any other output signal). In FIG. 3, $\phi 1$ is the delayed inverse of crs and $\phi 3$ is the delayed inverse of $\phi 2$. To operate the system such that, for example, the phase detector always operates on the rising edge of an input signal, inverting and/or amplifying stages such as A1 and A2 having negligible delay may be introduced in the path of the odd (or even) numbered phase signals (e.g., $\phi$ and $\phi 3$). Thus, where the circuit of FIG. 3 is incorporated into the system of FIG. 2, the signals $\phi 1$-NOT and $\phi 3$-NOT (as shown in FIG. 4) could be supplied to MUX 20 instead of $\phi 1$ and $\phi 3$. Although not explicitly shown, it should be understood that signals having the correct polarity will be generated and applied where necessary. In the operation of the circuit, the control voltage, VCTL, produced by the filter network 18 controls the voltage applied across the inverters $I_1$–$I_5$, which voltage is then used to control the delay of each inverter. In a VCO, changing the delay of the inverters forming the VCO causes a change in the frequency of operation of the VCO as well as in its phasing.

As shown in FIGS. 2 and 3, the different output signals ($\phi 1$, $\phi 2$, $\phi 3$, $\phi 4$ and crs) of the VCO are applied to mulitplexer 20 which is operated so as to couple one of these output signals at a time to the output 230 of multiplexer 20 which is controlled by a control signal CTLS. The control signal CTLS determines which one of the clock signals produced at the outputs of the VCO 42 (and supplied to multiplexer 20) gets coupled to the multiplexer output line 231 and via line 231 to input 141 of phase detector 14. For the example of FIGS. 3 and 4, the signals switched onto the mulitplexer output line 231 will change in discrete steps between adjacent clock signals and the spacing of these clock signals will vary in quantum steps (e.g., T/10 in FIG. 4) and hence, the multiplexer output on line 231 will "jump" between (or from) one clock having one phase to another clock of like frequency having another phase. [In the operation of the system, the multiplexer is controlled by circuits (not shown) such that, normally, adjacent clock signals (phases) are switched onto the multiplexer output line to limit the step size at any one switching time.] In contrast to the quantum jumps of the clock signals at the output of the multiplexer, the preselected clock recovery signal (crs) supplied to phase detector 22, for doing the phase comparison with the incoming data signals, varies slowly and gradually, as detailed below.

The control voltage (VCTL) applied to VCO 42 varies gradually over time. Since the gradually varying voltage (VCTL) is applied to the inverters of VCO 42, the phase (and frequency) of the clock signals will also vary gradually over time. That is, because of the integrating network of filter 18, the variation in phase and frequency of the VCO output signals will occur over several cycles. Therefore, it is evident that the clocking or timing signal used to perform the phase comparison with the incoming data signal is slowly varying and gradually changing.

The sampling signal (crs) is applied to one input 221 of phase detector 22 and to one input 261 of a data sampling flip flop 26. The incoming data signal (DATA) is applied to a second input, 222, of phase detector 22 and to a second input, 262, of flip flop 26. A difference between the phase of the incoming data signals and the sampling signal (crs) produces an error signal at the output 223 of phase detector 22 which is applied to a control circuit 25a which produces a control signal CTLS indicative of the nature (polarity) of the error. The CTLS signal is applied to multiplexer 20 and determines which one of the output clock signals produced by VCO 42 (e.g., which one of clocks $\phi 1$, $\phi 2$, $\phi 3$, $\phi 4$ and crs shown in FIGS. 3 and 4) is selected and switched to the output 230 of the multiplexer to be fed back to phase detector 14. When the incoming data signal and the sampling/timing signal (crs) are in phase, the error output of phase detector 22 will be essentially zero and the sampling signal (crs) will be locked onto the "correct" frequency and phase value of the incoming data. It should be noted that, alternatively, any one of $\phi 1$, $\phi 2$, $\phi 3$ or $\phi 4$ could be connected to input 221 of phase detector 22, instead of crs.

Concurrently, the sampling/timing signal (cs) functions to sample the incoming data signals by means of data sampling flip-flop 26 and produces the "retimed" data which is then fed from the output of flip-flop 26 to a data processing system 28.

By way of example, in a system embodying the invention, if the data stream signals are not in phase with the clock recovery signal (crs), the phase detector 22 and the control circuit 250 produce a control signal (CTLS) which cause the output of the multiplexer to switch from one clock signal (e.g., $\phi 1$) to a new clock signal (e.g., $\phi 2$). The new clock signal (e.g., $\phi 2$) is applied to phase detector 14 causing an error signal at the output of the phase detector whenever the new clock signal is not in phase with fref. The error signal then causes the control voltage (VCTL) developed across filter 18 to rise or fall, depending on the polarity of the error signal. The control voltage (VCTL) is applied to VCO 42 to cause the new clock signal (e.g., $\phi 2$) to vary in a direction which will cause the error output of the phase detector 14 to go to zero, at which point the phase of the new clock signal would be coincident (in-phase). Thus, the clock recovery signal (crs), and all the other outputs of the VCO 42, changes slowly and gradually from one value to another value, over several clock cycles. This slow change in the clock recovery signal results in a significant reduction in the jitter of retimed data.

It has therefore been demonstrated that, in contrast to prior art systems, where the peak cycle-to-cycle jitter is equal to, or greater than, the phase spacing between the different phases of the VCO, in systems embodying the invention the jitter introduced into the retimed data and the rest of the system 28 when the multiplexer is switched from one clock signal having a certain phase to another clock signal having a different phase is significantly reduced.

In prior art systems, in order to reduce the jitter, a VCO or (VCDL) would be made with a large number of cascaded inverters. The larger the number of cascaded stages, the lower the spacing between clock phases can be made. However, for a VCO, the number of cascaded stages limits the highest frequency which may be obtained. By way of example, a 16 phase VCO (or VCDL) operated with a reference signal (fref) having a frequency of 100 MHz will have a peak cycle-to-cycle jitter of T/16 where T is equal to 1/f ref. For these values the peak cycle-to-cycle jitter is equal to 0.625 nanoseconds. This amount of jitter is introduced each time the multiplexer 20 is switched from one phase to the next.

In sharp contrast, in the circuit of FIG. 2, the signal crs (or any other clock output signal of VCO 42) will gradually converge towards the selected phase after each switching of the multiplexer 20 supplying a new phase signal to phase detector 14. The automatic smoothing by the feedback phase selection scheme, in accordance with the invention, eliminates the phase steps and results in much lower jitter than any known prior art phase selecting clock recovery system. The phase locked loop (PLL) comprising phase detector 14, charge pump circuit 16, filter 18, VCO 42 and MUX 20 functions to filter the generated phase steps through the loop path. This reduces the output jitter of any one of the VCO clock outputs (e.g., crs) by spreading out the phase change of the clock output over many cycles.

Figure 5:
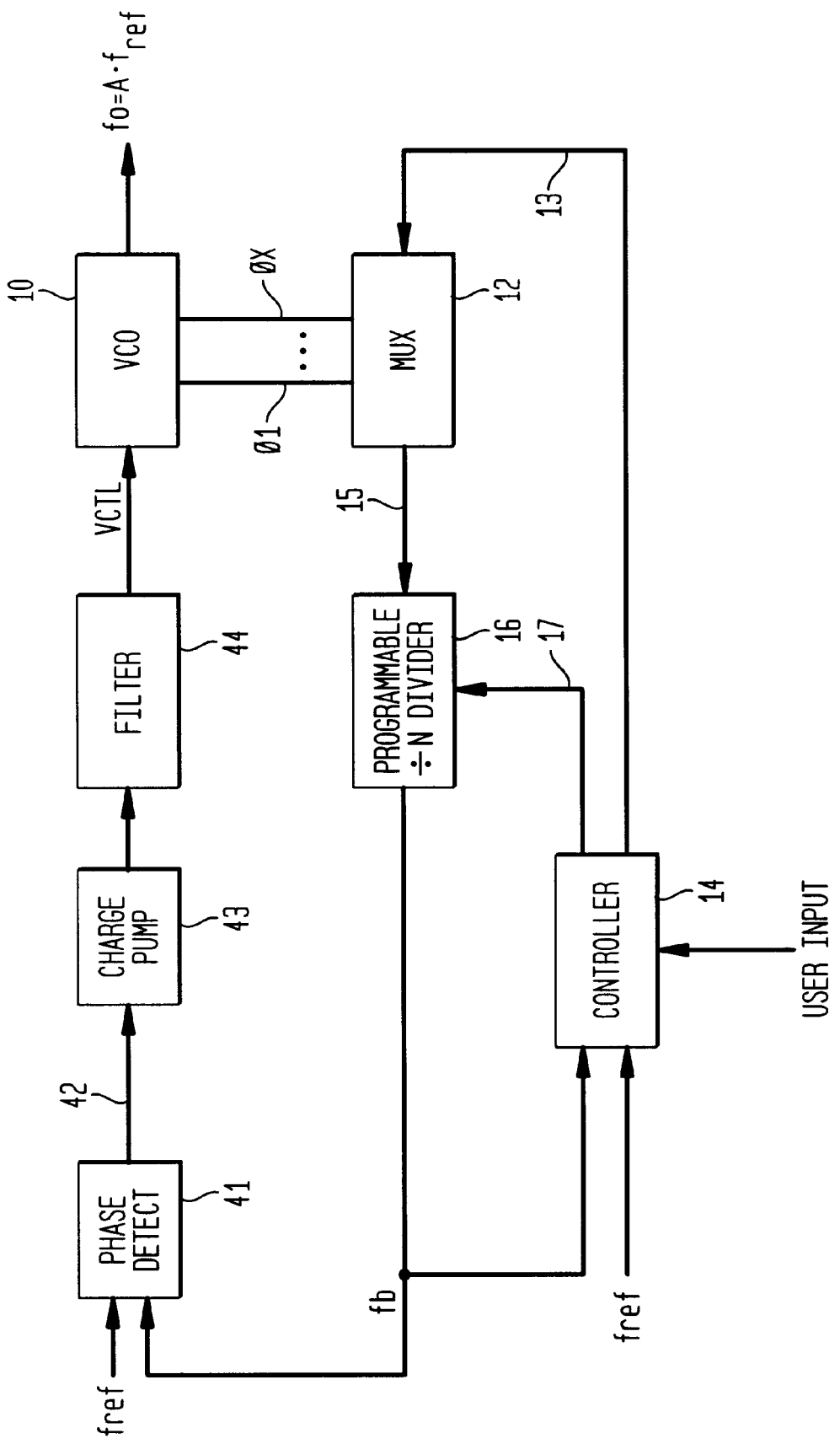
FIG. 5 is a block diagram of another clock recovery system embodying the invention.

FIG. 5 shows an embodiment of the invention using voltage control delay lines (VCDLs). In FIG. 5, first and second phase locked loops (PLL1A and PLL1B) are used to compare the output 230*a* of a MUX 20*a* with a reference frequency signal (fref). Each one of the first and second PLLs includes a local source of reference signals, fref, which is supplied to one input of a phase detector (14*a*, 14*b*) and the input of a four stage VCDL (12*a*, 12*b*), also denoted as VCDL1A and VCDL1B. The second input to each phase detector 14*a* and 14*b* is the output of MUX 20*a*. The output of each phase detector (14*a*, 14*b*) controls whether its corresponding charge pump (16*a*, 16*b*) supplies a charging or a discharging current to its corresponding filter (18*a*, 18*b*). Each one of filters (18*a*, 18*b*) is a low pass integrating circuit producing a control voltage, VCTL1A, on line 19*a* and VCTL1B, on line 19*b*, which is applied to the stages of a corresponding voltage control delay line (VCDL1A, VCDL1B) to control and vary the phasing of the clock signal being propagated through the delay line. The output flo$_A$ of VCDL1A and the output flo$_B$ of VCDL1B are supplied to a multiplexer 51. Multiplexer 51 is controlled by a controller and counter logic circuit 53 which determines whether flo$_A$ or flo$_B$ is supplied to the output of MUX 51. The determination by controller circuit 53 as to whether flo$_A$ or flo$_B$ is fed through MUX 51 depends on the following: If there is a frequency difference between fref and the received data, the delay of VCDL1A and VCDL1B would continuously increase or decrease. These VCDL's operate best in a limited range of delays. To limit the delay range, the output of VCDL1A is first selected by MUX 51 to generate the clock flo while VCDL1B is reset by controller 53. When the delay through VCDL1A has increased/decreased by one (1) clock cycle, MUX 51 is switched to select the output of VCDL1A. At the same time, VCDL1A is reset. The controller circuit 53 also functions to selectively clamp the output of filter 18*a* or filter 18*b*. The reason for clamping the outputs of filters 18*a* or 18*b* is to disable the filter output wher its corresponding VCDL is not selected. The ouput of MUX 51 is supplied to another phase locked loop (PLL2) which is used to compare the output flo from MUX 51 with the output f2o of the second PLL.

PLL2 also includes a VCDL, denoted as VCDL2, and a phase detector 14*c*. The signal flo is supplied to one input of phase detector 14*c* and to the input of VCDL2. In FIG. 5 VCDL2 is shown to include 4 stages with each stage providing the same delay for the same value of operating voltage VCTL2. In FIG. 5, VCDL2 is shown to produce 4 different clock signals ($\phi$1, $\phi$2, $\phi$3 and $\phi$4) with each clock signal being of the same frequency as flo and with each one being delayed substantially by the same amount relative to its adjacent clock signal; (i.e., each stage of the VCDL provides a substantially equal delay to its input signal). Therefore, each one of the 4 clock signals has a fixed, quantum, spacing relative to any of the other clock signals.

[It should be understood that VCDL2 (as well as VCDL1A and VCDL1B) may have a greater or smaller number of stages.] The output f2o of the last stage of VCDL2 is fed back to the second input of phase detector 14*c* and functions as the recovery clock. That is, f2o is applied to a phase detector 22*a* which compares f2o to a stream of incoming data signals (DATA). The output of detector 22*a* is supplied to a control circuit 25*a* which produces a control signal (CTLS) at its output which is applied to a MUX 20*a* in order to control which phase of VCDL2 gets coupled to the output of MUX 20*a* and then to the inputs of phase detectors 14*a* and 14*b* of PLL1A and PLL1B.

If f2o is not in phase with the incoming date stream, a control signal is fed to MUX 20*a* to cause it to switch from the clock signal which is being used (e.g., $\phi$2) to an adjacent clock signal (e.g., $\phi$1 or $\phi$3). The adjacent clock signal (e.g., $\phi$1 or $\phi$3) is then fed to the first group of PLLs (PLL1A and PLL1B). The new clock signal applied to PLL1A or PLL1B will, after being compared to fref, cause a corresponding change (i.e., an increase or a decrease) in the output of filter 18*a* or filter 18*b* (i.e., VCTL1A or VCTL1B). These changes in the control voltage will then cause a corresponding slow and gradual shift in the phasing of f1o$_A$ or f1o$_B$, resulting in a corresponding change in flo supplied to PLL2. The slow and gradual change in f1o causes a corresponding slow and gradual shift in the clock signals produced by VCDL2, with f2o driven to be in phase with f1o.

As in the case of the VCO based circuit of FIG. 2, the VCDL based circuit of FIG. 5 produces a clock recovery signal f2o which varies slowly and gradually and results in a low jitter sampling of the data input signals. That is, the clock recovery signal f2o applied to the data sample frequency flip-flop 26 to which the incoming data is applied produces "retimed data" having very low jitter. The retimed data may be supplied to a logic system 28 for processing and the clock recovery signal also may be supplied to the rest of the system (not shown) to produce timing and clock signals with very low jitter content.

The VCO based circuit of FIG. 2 may be modified as shown in FIG. 6 to include a divide-by-N network 60 in the feedback path between the output 230 of MUX 20 and the input 141 of phase detector 14. Insertion of a divide-by-N network in the feedback path enables the clock recovery circuit to produce a clock signal which is equal to N times fref [i.e., f2o is equal to (N)(fref)]. Feeding the output of the MUX 20 to divide-by-N network 60 enables fractional division, as more fully described in my copending application titled "Fractional Frequency Divider", bearing Ser. No. 08/208,299 and assigned to the same assignee as this application, the teachings of which are incorporated herein by reference. Also, the control circuit 25*a* may be used to control and alter the divider ratio "N" of the divider network 60. This enables a wide ranging fractional division to be performed with little jitter.

The circuits of FIG. 6 may be further modified as shown in FIG. 7 where the divide-by-N circuit 60*c* is shown to be programmable and controllable by means of a controller 62. The controller 62 may be a finite state machine used to sequence the selection of the phase steps produced at the output of MUX such that the combination of MUX 20*b* and programmable divider 60*c* may be operated as a fractional divider under the control of controller 62.

The circuit of FIG. 7 may be used to reduce the jitter noise associated with a fractional frequency divider. That is, where it is desired and/or necessary to have a clock frequency (fo) at the output of the VCO which is a fractional multiple of the reference frequency (fref), the circuit of FIG. 7 may be used to divide by a fractional number with reduced jitter. With a 4-phase VCO, a division by 8.25 is accomplished by a fixed division by 8 and the slected application of control signals to the multiplexer 20*c* to select different phases of the VCO output signals. For this circuit, and assuming that the phase detector is arranged to respond to one signal transition (e.g., low to high), then the phase error will theoretically be zero.

What is claimed is:

1. Apparatus comprising:
   a voltage responsive circuit for producing X different clock signals, where X is an integer greater than one (1), each one of said X clock signals having the same frequency and a different phase;
   means for applying a control voltage to the voltage responsive means, with the phase of each one of the X clock signals varying as a function of an amplitude of the control voltage applied to the voltage responsive circuit;
   circuitry, including a phase comparator responsive to an incoming data signal and to a predetermined one of said X clock signals for producing at an output of said phase comparator a control signal and said circuitry including a multiplexer being responsive to said control signal for selecting one of the X clock signals; and
   wherein said means for applying a control voltage includes comparator circuitry for comparing the selected one of the X clock signals with a reference frequency signal for varying the amplitude of the control voltage applied to the voltage responsive circuit.

2. Apparatus as claimed in claim 1 wherein said circuitry for selecting any one of the X clock signals and for comparing the selected clock signal with a reference frequency signal for producing the control voltage applied to the voltage responsive circuit includes circuitry for causing the selected clock signal to tend to become substantially in-phase with the reference frequency signal and with the phase of the remaining ones of the X clock signals being correspondingly shifted relative to the reference frequency signal.

3. Apparatus as claimed in claim 1 wherein said circuitry for selecting any one of the X clock signals includes a multiplexer having an input port for receiving said X clock signals and having an output, said multiplexer being responsive to a control signal, generated by said phase comparator, for coupling a selected one of said X clock signals to the multiplexer output; and
   wherein one of said X clock signal is fixedly designated as an output of said apparatus.

4. Apparatus as claimed in claim 1 wherein said circuitry for selecting any one of the X clock signals and for comparing the selected clock signal with a reference frequency signal circuitry includes: (a) selection circuitry having an input port for receiving said X clock signals and having an output, and said selection circuitry being responsive to a control signal for, in response to said control signal, coupling a selected one of said X clock signals to the selection circuitry output; and (b) said phase comparator responsive to an incoming data signal and to a preselected one of said X clock signals includes circuitry for comparing the preselected one of the X clock signals with the incoming data signal for producing said control signal and for applying said control signal to said selection circuitry.

5. Apparatus as claimed in claim 4 wherein said circuitry for selecting any one of the X clock signals and for comparing the selected clock signal with a reference frequency signal includes phase detecting circuitry, other than said phase comparator, than having an input part to which is applied the output of said selection circuitry and said reference frequency signal for producing said control voltage.

6. Apparatus as claimed in claim 5 wherein said circuitry for comparing the selected clock signal with a reference frequency signal for producing the control voltage applied to the voltage responsive circuit includes a phase detector responsive to the reference signal and the selected clock signal for producing an error signal at the output of the phase detector which is applied to a charge pump circuit for controlling a charge pump output current supplied to a filter circuit for developing the control voltage which is applied to the voltage responsive circuit.

7. Apparatus as claimed in claim 6, wherein said filter circuit is a low pass integrating filter.

8. Apparatus as claimed in claim 7, wherein said circuitry for selecting any one of the X clock signals includes a multiplexer having an input port for receiving said X clock signals and having an output, wherein said phase comparator circuit responsive to an incoming data signal and to a preselected one of said X clock signals produces said control signal supplied to said multiplexer for selecting one of said X clock signals.

9. Apparatus as claimed in claim 7, wherein said voltage responsive circuit is a voltage controlled oscillator.

10. Apparatus as claimed in claim 5, wherein the circuitry for selecting any one of the X clock signals and for comparing the selected clock signals with a reference frequency signal for producing the control voltage includes:
    (a) a first loop for comparing the output of the multiplexer with the reference frequency signal and said first loop including a first voltage controlled delay line for producing a first control frequency signal tending to become in-phase with the reference frequency signal; and
    (b) wherein the voltage responsive circuit includes a second loop including a second voltage controlled delay line for comparing the first control frequency signal with a preselected one of the X clock signals of the voltage responsive circuit for producing a controlled voltage supplied to the second voltage controlled delay line.

11. Apparatus as claimed in claim 5 wherein said phase detecting circuitry includes a phase detector having a first input to which is applied the reference signal and having a second input which is connected via a divide-by-N network to the output of the selection circuitry and wherein the phase detector produces an error signal at the output of the phase detector which is applied to a charge pump circuit for controlling a charge pump output current supplied to a filter circuit for developing the control voltage which is applied to the voltage responsive circuit.

12. Apparatus as claimed in claim 5, wherein the circuitry for selecting any one of the X clock signals and for comparing the selected clock signals with a reference frequency signal for producing the control voltage includes:
    (a) a first loop for comparing the output of the multiplexer with the reference frequency signal and said first loop including first and second voltage controlled delay lines for producing first and second control frequency signals tending to become in-phase with the reference frequency signal; and
    (b) wherein the voltage responsive circuit includes a second loop including a third voltage controlled delay line for comparing a selected one of the first and second control frequency signals with a preselected one of the X clock signals of the voltage responsive circuit for producing a controlled voltage supplied to the second voltage controlled delay line.

13. Apparatus comprising:
a first phase detector having first and second inputs and an output, the first input being adapted to receive a reference frequency (fref) signal and the second input being adapted to receive a second signal, said first phase detector producing a signal at its output which is applied to a charge pump circuit for controlling a charge pump output current which is supplied to a filter circuit for developing a control voltage which is applied to a voltage controlled oscillator (VCO), the VCO for producing a number of clock signals having the same frequency but different phases;
means for receiving data input signals; and
circuitry coupled to receive said number of clock signals and including a second phase detector responsive to said data input signals and to a predetermined one of the clock signals of the VCO for producing a control signal for selectively coupling a selected one of the clock signals from the VCO to the second input of the first phase detector.

14. Apparatus as claimed in claim 13, wherein the circuitry responsive to the data input signal and to a preselected one of the clock signals of the VCO includes: (a) phase detecting circuitry, other than said first phase detector, for comparing these signals and for producing a control signal; and (b) multiplexing circuitry for receiving a predetermined number of said clock signals from the VCO and for, in response to the control signal, selecting which one of the clock signals gets coupled to the second input of the phase detector.

15. Apparatus as claimed in claim 14, wherein the phase detecting circuitry includes a second phase detector having a first input to which is applied said data input signals, a second input to which is applied the preselected clock signal from the VCO, and said second phase detector having an output coupled to a control signal producing circuitry for producing the control signal and for applying the control signal to said multiplexing circuitry.

16. Apparatus as claimed in claim 15, wherein the data input signals and the preselected clock signal from the VCO are applied to a data sampling flip-flop for producing retimed data signals.

17. Apparatus as claimed in claim 16, wherein the retimed data signals is supplied to a logic system for processing the retimed data signals.

18. Apparatus as claimed in claim 13, wherein the circuitry responsive to the data input signal and to a preselected one of the clock signals of the VCO includes: (a) phase detecting circuitry for comparing these signals and producing a control signal; (b) multiplexing circuitry for receiving a predetermined number of clock signals from the VCO and for, in response to the control signal, selecting which one of the predetermined clock signals gets coupled to the output of the multiplexer, and (c) a divide-by-N circuit coupled between the output of the multiplexer and the second input of the phase detector.

19. Apparatus comprising:
a first phase detector having a first input adapted to receive a reference frequency (fref) signal and a second input adapted to receive a feedback signal and having an output coupled to a charge pump circuit for controlling a charge pump output current supplied to a filter circuit for developing a control voltage which is applied to a voltage responsive circuit, the voltage responsive circuit producing a predetermined number of clock signals whose frequency and phase vary as a function of the control voltage, and the predetermined number of clock signals having the same frequency, with each clock signal being delayed by a fixed time delay relative to each other;
a multiplexer having an input port for receiving the predetermined number of clock signals and the multiplexer being responsive to a control signal for selectively coupling one of the predetermined number of clock signals to the second input of the first phase detector; and
a second phase detector;
means for applying an incoming data signal to said second phase detector and a selected one of said clock signals to said second phase detector whereby said second phase detector is responsive to said incoming data signal and to said selected one of the clock signals for producing said control signal.

20. Apparatus as claimed in claim 19 wherein the voltage responsive circuit is a voltage controlled oscillator.

21. Apparatus comprising:
a phase detector having a first input adapted to receive a reference frequency (fref) signal and a second input adapted to receive a feedback signal and said phase detector having an output coupled to a charge pump circuit for controlling a charge pump output current supplied to a filter circuit for developing a control voltage which is applied to a voltage responsive circuit, the voltage responsive circuit, in response to the control voltage, producing a predetermined number of clock signals having the same frequency, with each clock signal being delayed relative to any other clock signal by a fixed time delay which is a function of the control voltage;
a multiplexer for receiving the predetermined number of clock signals and responsive to a control signal for coupling one of the predetermined number of clock signals to the second input of the phase detector; and
circuitry responsive to a data signal and to a preselected clock signal from the voltage responsive circuit for producing the control signal supplied to the multiplexer.

22. Apparatus as claimed in claim 21 wherein the voltage responsive circuit is a voltage controlled oscillator.

23. Apparatus as claimed in claim 22, wherein the multiplexer has an input port for receiving the predetermined number of clock signals and has an output at which, in response to the control signal, is selectively coupled one of the predetermined clock signals, and a divider-by-N network connected between the output of the multiplexer and the second input of the phase detector.

24. Apparatus comprising:
a voltage responsive circuit for producing a number of different clock signals having the same frequency with each different clock signal being delayed relative to any other clock signal by a certain time delay which is a function of an amplitude of a control voltage applied to the voltage responsive circuit;
a multiplexer for receiving a number of said different clock signals and having an output for, in response to a control signal, coupling a selected one of said different clock signals to the multiplexer output;
a first phase detector responsive to a reference signal and to the output of the multiplexer for producing an error signal applied to a charge pump circuit for controlling a charge pump output current supplied to a filter circuit for developing the control voltage applied to the voltage responsive circuit; and a second phase detector responsive to data input signals and to a predetermined one of said different clock signals for producing the control signal applied to said multiplexer.

25. Apparatus as claimed in claim 24 wherein said voltage responsive circuit is a voltage controlled oscillator (VCO).

26. Apparatus as claimed in claim 24 wherein said voltage responsive circuit is a voltage controlled delay line (VCDL).

27. A method for producing a low jitter clock signal comprising the steps of:

producing X clock signals having the same frequency but with different phases; where X is an integer greater than one (1);

selectively selecting different ones of said X clock signals as a function of comparing an incoming data stream and a preselected one of the X clock signals and comparing the selected clock signals with a reference signal for producing an error signal indicative of a phase difference between the selected clock signal and the reference signal;

changing at least one of the phase and frequency of the X clock signals as a function of the amplitude and polarity of the error signal; and comparing a preselected one the X clock signals with said incoming data stream for sensing the frequency of incoming data stream and for sampling the contents of the data stream.

28. A method as claimed in claim 27 wherein the producing of the X clock signals includes a voltage responsive circuit; and wherein the changing of at least one of the phase and frequency of the X clock signals includes the production of a gradually varying control voltage and applying the gradually varying control voltage to the voltage responsive circuit.

29. A method as claimed in claim 28 wherein the voltage responsive circuit is a voltage controlled oscillator (VCO).

30. A method as claimed in claim 28 wherein the voltage responsive circuit is a voltage controlled delay line (VCDL).

31. A method as claimed in claim 28 wherein selectively selecting different ones of said X clock signals includes a multiplexer having an input port for receiving said X clock signals and having an output at which is selectively produced one of said X signals in response to the application of a control signal to the multiplexer.

32. A method as claimed in claim 27 wherein the changing of at least one of the phase and frequency of the X clock signals as a function of the amplitude and polarity of the error signal includes a charge pump circuit which charges and discharges a low pass filter circuit for developing the control voltage which is applied to the voltage responsive circuit.

33. A method as claimed in claim 32 wherein comparing the selected clock signals with a reference signal includes the application of these two signals to a phase detector for producing said error signal.

34. A method as claimed in claim 27 wherein the comparing of a preselected one of the X clock signals with an incoming data stream includes the application of the preselected clock signal and the incoming data stream to a phase detector to produce a control signal for determining which clock signal is selected for comparison with the reference signal.

35. A method for producing a low jitter clock signal comprising the steps of:

applying a control voltage to a voltage responsive circuit for producing X different clock signals having the same frequency with each different clock signal being delayed relative to any of the other clock signal by an amount which is a function of the control voltage; where X is an integer greater than one (1);

selectively selecting different ones of said X clock signals in response to a control signal;

comparing the selected clock signal with a reference signal for producing an error signal indicative of a phase difference between the selected clock signal and the reference signal and for producing the control voltage to be applied to the voltage responsive circuit; and comparing a preselected one of the X clock signals with an incoming data stream for sensing the frequency of the incoming data stream and producing the control signal.

36. Apparatus comprising:

a voltage responsive circuit for producing X different clock signals, where X is an integer greater than one (1), each one of said X clock signals having the same frequency and a different phase, means for applying a control voltage to the voltage responsive means wherein the phase of each one of the X clock signals varies as a function of an amplitude of the control voltage applied to the voltage responsive circuit;

a selection circuit for receiving said X clock signals and having an output, said selection circuit being responsive to a control signal for coupling a selected one of said X clock signals to the selection circuit output;

circuitry for comparing a designated one of the X clock signals with a data input stream for producing said control signal as a function of a difference and for applying said control signal to said selection circuit; and circuitry responsive to the output of said selection circuit and to a reference frequency signal for producing said control voltage which is a function of a difference between the signal at the output of the selection circuit and the reference frequency signal.

* * * * *